(12) United States Patent
Yamaguchi et al.

(10) Patent No.: US 6,620,641 B2
(45) Date of Patent: Sep. 16, 2003

(54) SEMICONDUCTOR LIGHT EMITTING DEVICE AND ITS MANUFACTURING METHOD

(75) Inventors: Takashi Yamaguchi, Kanagawa (JP); Toshimasa Kobayashi, Kanagawa (JP); Satoru Kijima, Miyagi (JP); Takashi Kobayashi, Kanagawa (JP); Tsunenori Asatsuma, Kanagawa (JP); Takeharu Asano, Kanagawa (JP); Tomonori Hino, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/172,839

(22) Filed: Jun. 17, 2002

(65) Prior Publication Data

US 2002/0153528 A1 Oct. 24, 2002

Related U.S. Application Data

(62) Division of application No. 09/448,589, filed on Nov. 24, 1999, now abandoned.

(30) Foreign Application Priority Data

Nov. 26, 1998 (JP) .......................................... P10-335853

(51) Int. Cl.$^7$ .............................................. H01L 21/00
(52) U.S. Cl. .............................. 438/22; 438/24; 438/46; 438/47; 438/604; 438/634; 438/740
(58) Field of Search .............................. 438/22, 24, 36, 438/37, 46, 47, 604, 607, 634, 740

(56) References Cited

U.S. PATENT DOCUMENTS 5,029,175 A * 7/1991 Ohnaka et al. ................ 372/46
5,310,697 A * 5/1994 Kan et al. .................... 437/129
5,518,954 A 5/1996 Yoo et al.

FOREIGN PATENT DOCUMENTS

EP 0 395 392 A2 10/1990
EP 0 851 542 A2 7/1998

* cited by examiner

*Primary Examiner*—Long Pham
*Assistant Examiner*—Wai-Sing Lovie
(74) *Attorney, Agent, or Firm*—Sonnenschein, Nath & Rosenthal LLP

(57) ABSTRACT

A GaN compound semiconductor laser includes an AlGaN buried layer which buries opposite sides of a ridge stripe portion formed on a p-type AlGaN cladding layer. The AlGaN buried layer is made by first patterning an upper part of the p-type AlGaN cladding layer and a p-type GaN contact layer into a ridge stripe configuration by using a $SiO_2$ film as an etching mask, then growing the AlGaN buried layer non-selectively on the entire substrate surface to bury both sides of the ridge stripe portion under the existence of the $SiO_2$ film on the ridge stripe portion, and thereafter selectively removing the AlGaN buried layer from above the ridge stripe portion by etching using the $SiO_2$ film as an etching stop layer. Thus, the GaN compound semiconductor laser is stabilized in the transverse mode, intensified in output power, and improved in lifetime.

8 Claims, 18 Drawing Sheets

SEMICONDUCTOR LIGHT EMITTING DEVICE AND ITS MANUFACTURING METHOD

CROSS REFERENCE TO RELATED APPLICATIONS

This is a divisional of U.S. application Ser. No. 09/448,589, filed on Nov. 24, 1999, now abandoned which claims priority to Japanese Application No. P10-35853 filed Nov. 26, 1998, both of which are incorporated herein by reference to the extent permitted by law.

BACKGROUND OF THE INVENTION

1. Field of the Invention

This invention relates to a semiconductor light emitting device and its manufacturing method, especially suitable for application to a semiconductor light emitting device having a buried ridge structure and using nitride III–V compound semiconductors, and to fabrication thereof.

2. Description of the Related Art

Nitride III–V compound semiconductors represented by gallium nitride (GaN) are hopeful materials of light emitting devices capable of emitting light over a wide range from the green to blue and further to ultraviolet range, high-frequency electronic devices and anti-environmental electronic devices, for example. Particularly, since light emitting diodes using nitride III–V compound semiconductors were brought into practical use, nitride III–V compound semiconductors has been remarked largely. Realization of semiconductor lasers using nitride III–V compound semiconductors was also reported, and their application to light sources of optical disc apparatuses are hopefully expected.

A conventional GaN compound semiconductor laser is explained here. In the conventional GaN compound semiconductor laser, sequentially stacked by low-temperature growth on a c-plane sapphire substrate via a first GaN buffer layer are an n-type GaN contact layer, n-type AlGaN cladding layer, active layer, p-type AlGaN cladding layer and p-type GaN contact layer. The active layer has a single quantum well structure or a multi quantum well structure including a GaN layer as its emission layer. The upper-lying part of the p-type AlGaN cladding layer and the p-type GaN contact layer has a predetermined ridge stripe configuration extending in one direction. The upper-lying part of the n-type GaN contact layer, n-type AlGaN cladding layer, active layer and lower-lying part of the p-type AlGaN cladding layer has a predetermined mesa I configuration extending in parallel with the extending direction of the ridge stripe portion. Formed on the p-type GaN contact layer is a p-side electrode such as Ni/Pt/Au electrode or Ni/Au electrode in ohmic contact therewith, and formed on the n-type GaN contact layer in a location near the mesa portion is an n-side electrode such as Ti/Al/Pt/Au electrode in ohmic contact therewith.

In the conventional GaN compound semiconductor laser having the above-summarized structure, the upper-lying part of the p-type AlGaN cladding layer and the p-type GaN contact layer are patterned in to a ridge stripe configuration to restrict the current path, thereby to reduce the operation current and to control transverse modes by using a difference in effective refractive index between the ridge stripe portion and its opposite adjacent portions.

The conventional GaN compound semiconductor laser having the above-explained structure is manufactured as follows. That is, the first GaN buffer layer is grown on the c-plane sapphire substrate under a low temperature by metal organic chemical vapor deposition (MOCVD). Subsequently, by MOCVD, the second GaN buffer layer, n-type GaN contact layer, n-type AlGaN cladding layer, active layer, p-type AlGaN cladding layer and p-type GaN contact layer are sequentially grown on the first GaN buffer layer.

Then, after making a predetermined stripe-shaped mask extending in one direction on the p-type GaN contact layer, etching is conducted by reactive ion etching using the mask to the depth reaching an intermediate depth of the p-type AlGaN cladding layer to form the ridge stripe portion. Then, the mask is removed. After that, a predetermined stripe-shaped mask extending in one direction is formed on the p-type GaN contact layer and areas of the p-type GaN contact layer on both sides of the ridge stripe portion, and etching is conducted by RIE using this mask to the depth reaching a half depth of the n-type GaN contact layer to make a groove. Then, after removing the mask, the p-side electrode is formed on the p-type GaN contact layer, and the n-side electrode is formed on the n-type GaN contact layer.

After that, through the step of cleaving the sapphire substrate, having formed the laser structure as explained above, into bars along the direction vertical of the extending direction of the ridge stripe portion, or the step of dry etching, opposite cavity edges are made. Thereafter, each bar is divided into chips by dicing or scribing. Through these steps, the intended GaN compound semiconductor laser is completed.

In the conventional GaN compound semiconductor laser shown above, although it is controlled in transverse mode by using a difference in effective refractive index between the ridge stripe portion and its opposite adjacent portions, it is not configured to bury a semiconductor layer on both sides of the ridge stripe portion, unlike a buried ridge type AlGaAs compound semiconductor laser or AlGaInP compound semiconductor laser. Therefore, the conventional GaN compound semiconductor laser involved the problems that the difficulty in controlling transverse refractive index made it difficult to stabilize transverse modes, and its low heat dissipation effect made it difficult to realize a high output power and a long lifetime. Additionally, since the laser maintained the uneven structure made by the ridge stripe portion, an electrode made thereon for contact was liable to break due to a level difference. For this and other reasons, reliability of the laser was liable to decrease. Taking account of these matters, it is strongly desired to bury in both sides of the ridge stripe portion with an appropriate material also in the GaN semiconductor laser.

OBJECTS AND SUMMARY OF THE INVENTION

It is therefore an object of the invention to provide a semiconductor light emitting device using nitride III–V compound semiconductors, which is capable of stabilizing transverse modes and realizing a high output power and a long lifetime, and to provide a manufacturing method thereof.

According to the first aspect of the invention, there is provided a semiconductor light emitting device using a nitride III–V compound semiconductor, comprising:

a first cladding layer of a first conduction type;

an active layer on the first cladding layer;

a second cladding layer of a second conduction type on the active layer;

a stripe portion formed in the second cladding layer; and a buried layer burying opposite sides of the stripe portion, the buried layer being made by non-selectively growing the buried layer on the second cladding layer under the existence of a mask on the stripe portion and thereafter selectively removing the buried layer from above the stripe portion by etching using the mask on the stripe portion as an etching stop layer.

According to the second aspect of the invention, there is provided a manufacturing method for manufacturing a semiconductor light emitting device using a nitride III–V compound semiconductor, comprising the steps of:

sequentially growing a first cladding layer of a first conduction type, an active layer and a second cladding layer of a second conduction type on a substrate;

forming a stripe portion in the second cladding layer;

non-selectively growing a buried layer on the second cladding layer under the presence of a mask on the stripe portion; and selectively removing the buried layer from above the stripe portion by etching using the mask on the stripe portion as an etching stop layer.

In the present invention, from the viewpoint of ensuring good current blocking, the buried layer is typically of a first conduction type or undoped. In the invention, from the viewpoint of ensuring good control of transverse modes, the buried layer typically has a lower refractive index than the second cladding layer. If necessary, however, the buried layer may function to absorb light from the active layer.

In the present invention, the buried layer is typically made of a nitride III–V compound semiconductor and preferably made of AlGaN because it can produce a difference in refractive index in the transverse direction and can readily control the difference in refractive index by changing the Al composition.

In the present invention, the nitride III–V compound semiconductor contains at least one group III element selected from the group consisting of Ga, Al, In, B and Tl, and at least N with or without As or P as group V elements. Examples of such nitride III–V compound semiconductors are GaN, AlGaN, GaInN, AlGaInN, and so forth.

In the present invention, the semiconductor light emitting device typically has a first contact layer of the first conduction type between the first cladding layer and the substrate, and includes a second contact layer of the second conduction type on the second cladding layer. Additionally, the semiconductor light emitting device preferably includes a first optical guide layer between the first cladding layer and the active layer, and includes a second optical guide layer between the active layer and the second cladding layer.

In the present invention, the mask formed on the stripe portion is the mask used as the etching mask upon making the stripe portion in the second cladding layer. Typically used as the material of the mask is a dielectric material or an insulator, more specifically, silicon oxide ($SiO_2$) or silicon nitride (SiN). The mask is removed before providing an electrode in contact with the second cladding layer or the second contact layer of the second conduction type thereon.

In the second aspect of the invention, from the viewpoint of preventing damages to the surface of the buried layer on both sides of the stripe portion upon removal of the buried layer from above the stripe portion, another mask having an aperture in a location corresponding to the stripe portion is preferably made on the buried layer so as to selectively remove the buried layer from above the stripe portion by etching using the mask on the stripe portion and the mask on the buried layer as an etching stop layer.

In the second aspect of the invention, from the viewpoint of ensuring good surface smoothness of the buried structure, the buried layer is selectively removed from above the stripe portion by etching using a difference in crystallographic property between the buried layer grown on the second cladding layer and the buried layer grown on the mask on the stripe portion. This is attained by chemical etching using a potassium hydroxide solution, for example, as the etchant. In this case, the potassium hydroxide solution is preferably heated to a predetermined temperature, such as approximately 60° C.

In the present invention, by providing a coating film on the buried layer and conducting an etch-back process using the coating film and the mask on the stripe portion as an etching stop layer, the buried layer may be removed from above the stripe portion.

According to the invention having the above-summarized structure, since the buried layer is non-selectively grown on the second cladding layer under the existence of the mask on the stripe portion, and the buried layer located on the stripe portion is removed by etching using the mask on the stripe portion as an etching stop layer, the structure burying both sides of the stripe portion with the buried layer can be made with a sufficient reproducibility and stably while using materials difficult to selectively grow as the material of the buried layer. Therefore, room for selection of the material of the buried layer is expanded. Additionally, since the buried layer buries both sides of the stripe portion, the controllability of the transverse refractive index and the heat dissipation effect are improved.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
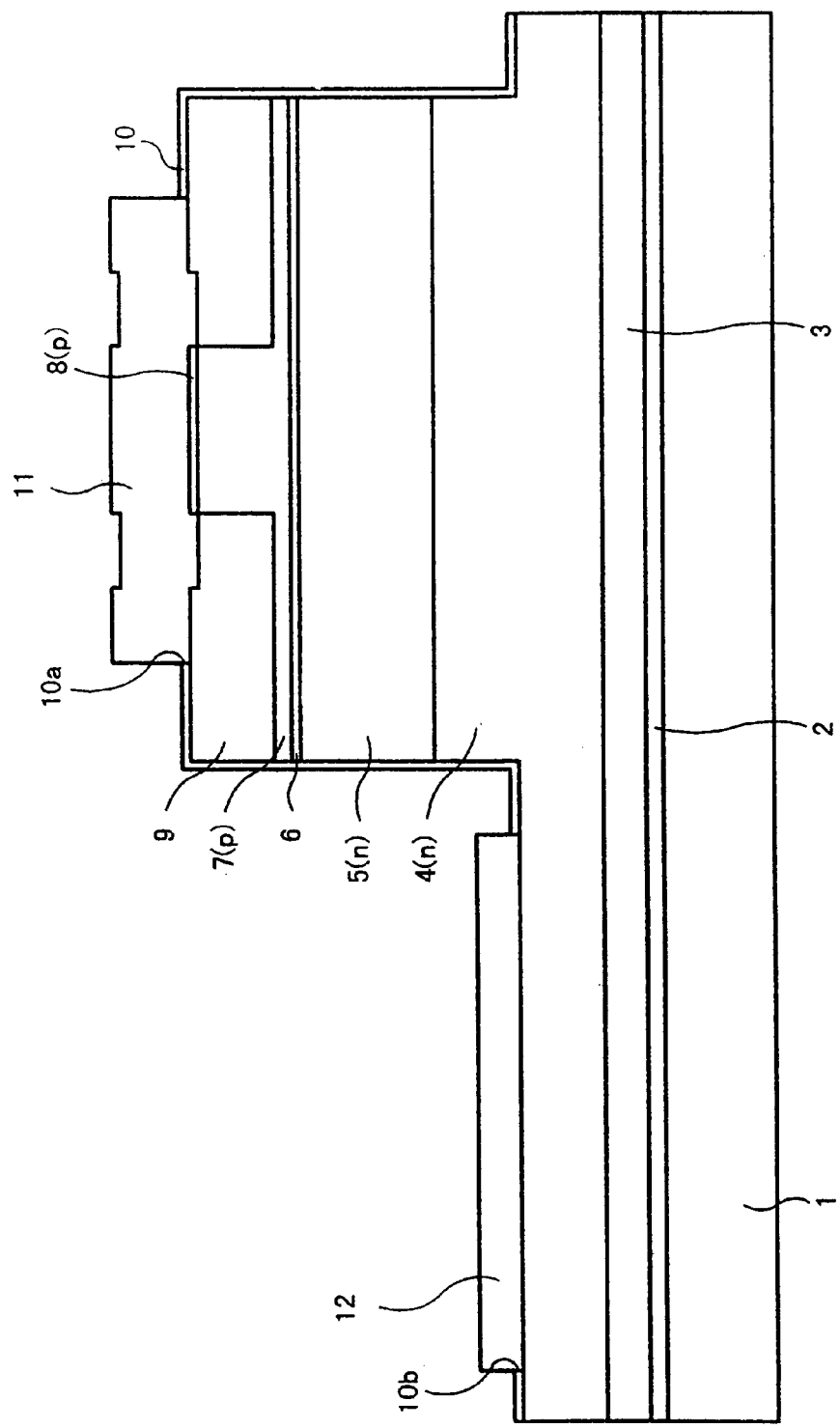
FIG. 1 is a cross-sectional view of a GaN compound semiconductor laser according to the first embodiment of the invention.

Some embodiments of the invention are explained below with reference to the drawings. In all of the drawings illustrating the embodiments, the same or equivalent components are labeled with common reference numerals.

To start with, the first embodiment of the invention is explained. FIG. 1 shows a GaN compound semiconductor laser according to the first embodiment.

As shown in FIG. 1, the GaN compound semiconductor laser according to the first embodiment includes a GaN buffer layer 3, n-type GaN contact layer 4, n-type AlGaN cladding layer 5, active layer 6, p-type AlGaN cladding layer 7 and p-type GaN contact layer 8 are sequentially stacked on a c-plane sapphire substrate 1 via a GaN buffer layer 2 by low-temperature growth. The active layer 6 has a single quantum well structure or a multi-quantum well structure including a GaInN layer, for example, as its emission layer. Composition of group III elements in the n-type AlGaN cladding layer 5 and the p-type AlGaN cladding layer 7 is 8% for Al and 92% for Ga, for example.

The upper-lying part of the p-type AlGaN cladding layer 7 and the p-type GaN contact layer 8 have a predetermined ridge stripe configuration extending in one direction. Width of the ridge stripe portion (stripe width) is 4 $\mu$m, for example. Both sides of the ridge stripe portion are buried with an undoped AlGaN buried layer (current blocking layer) 9, for example, to form a current blocking structure. Al composition in the AlGaN buried layer 9 is determined larger than the Al composition of the p-type AlGaN cladding layer 7. Therefore, the AlGaN buried layer 9 has a lower refractive index than the p-type AlGaN cladding layer 7. Composition of group III elements in the AlGaN buried layer 9 is 10% for Al and 90% for Ga, for example.

The upper-lying part of the n-type GaN contact layer 4, n-type AlGaN cladding layer 5, active layer 6, under-lying part of the p-type AlGaN cladding layer 7 and AlGaN buried layer 9 have a predetermined mesa configuration. A protective film (insulating film) 10 such as SiO$_2$ film is provided on the AlGaN buried layer 9, both side surfaces of the mesa portion and the n-type GaN contact layer 4 adjacent to the mesa portion. the protective film 10 has apertures 10a and 10b in locations corresponding to the ridge stripe portion and the part of the n-type GaN contact layer 4 adjacent to the mesa portion. Through the aperture 10a of the protective film 10, a p-side electrode 11 made of Ni/Pt/Au or Ni/Au is ohmic contact with the p-type GaN contact layer 8, whereas an n-side electrode 12 made of Ti/Al/Pt/Au is in ohmic contact with the n-type GaN contact layer 4 through the aperture 10b of the protective film 10.

An example of thicknesses of respective nitride III–V compound semiconductor layers forming the laser structure is: 4.5 $\mu$m for the n-type GaN contact layer 4, 1.3 $\mu$m for the n-type AlGaN cladding layer 5, 0.9 $\mu$m for the p-type AlGaN cladding layer 7 in the ridge stripe portion, 0.3 $\mu$m for the p-type AlGaN cladding layer 7 on both sides of the ridge stripe portion, and 0.1 $\mu$m for the p-type GaN contact layer 8.

The GaN compound semiconductor laser shown here is characterized in that the buried layer provided on both sides of the ridge stripe portion is made of AlGaN difficult to grow selectively. The AlGaN buried layer 9 is obtained by non-selectively growing an AlGaN layer on the p-type AlGaN cladding layer 7 under the existence of a mask on the ridge stripe portion as explained later, and thereafter removing the AlGaN layer from above the ridge stripe portion by etching using the mask on the ridge stripe portion as an etching stop layer.

In the GaN semiconductor laser having the above-explained structure, the AlGaN buried layer 9 provided on both sides of the ridge stripe portion has a lower refractive index than the p-type AlGaN cladding layer 7. Therefore, a step-like refractive index profile with a higher refractive index in the area corresponding to the ridge stripe portion and a lower refractive index in the areas on both sides of the ridge stripe portion is built in the laser, and the transverse mode is controlled by using the difference in effective refractive index.

Next explained is a manufacturing method of the GaN semiconductor laser according to the first embodiment.

Figure 2:
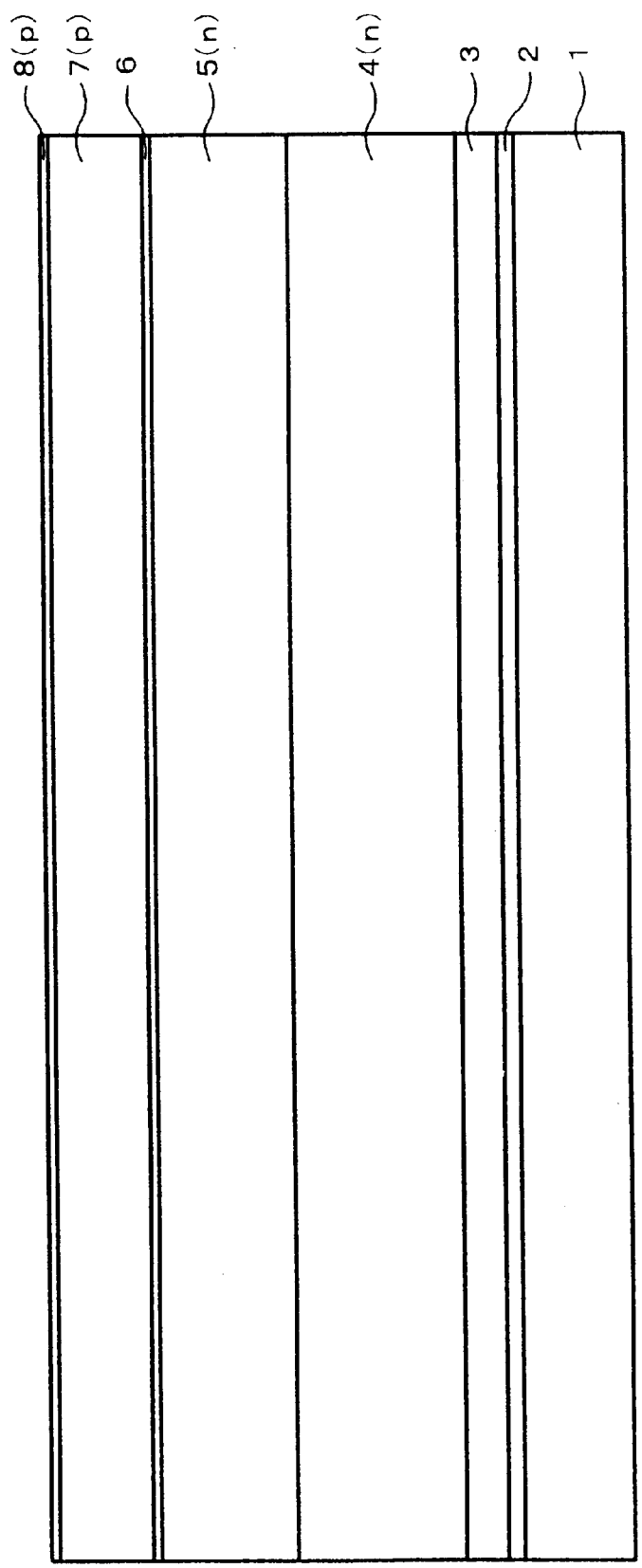
FIG. 2 is a cross-sectional view for explaining a manufacturing method of the GaN semiconductor laser according to the first embodiment of the invention.

First as shown in FIG. 2, the GaN buffer layer 2 is grown on the c-plane sapphire substrate 1 by MOCVD under a low temperature around 560° C., for example. Successively, by MOCVD, the GaN buffer layer 3, n-type GaN contact layer 4, n-type AlGaN cladding layer 5, active layer 6, p-type AlGaN cladding layer 7 and p-type GaN contact layer 8 are sequentially grown on the GaN buffer layer 2. Growth temperature is set to approximately 1000° C. in layers not containing In, namely, GaN buffer layer 3, n-type GaN contact layer 4, n-type AlGaN cladding layer 5, p-type AlGaN cladding layer 7 and p-type GaN contact layer 8, and 600° C. through 800° C. for growth of the active layer 6 containing In to prevent decomposition of InN.

Figure 3:
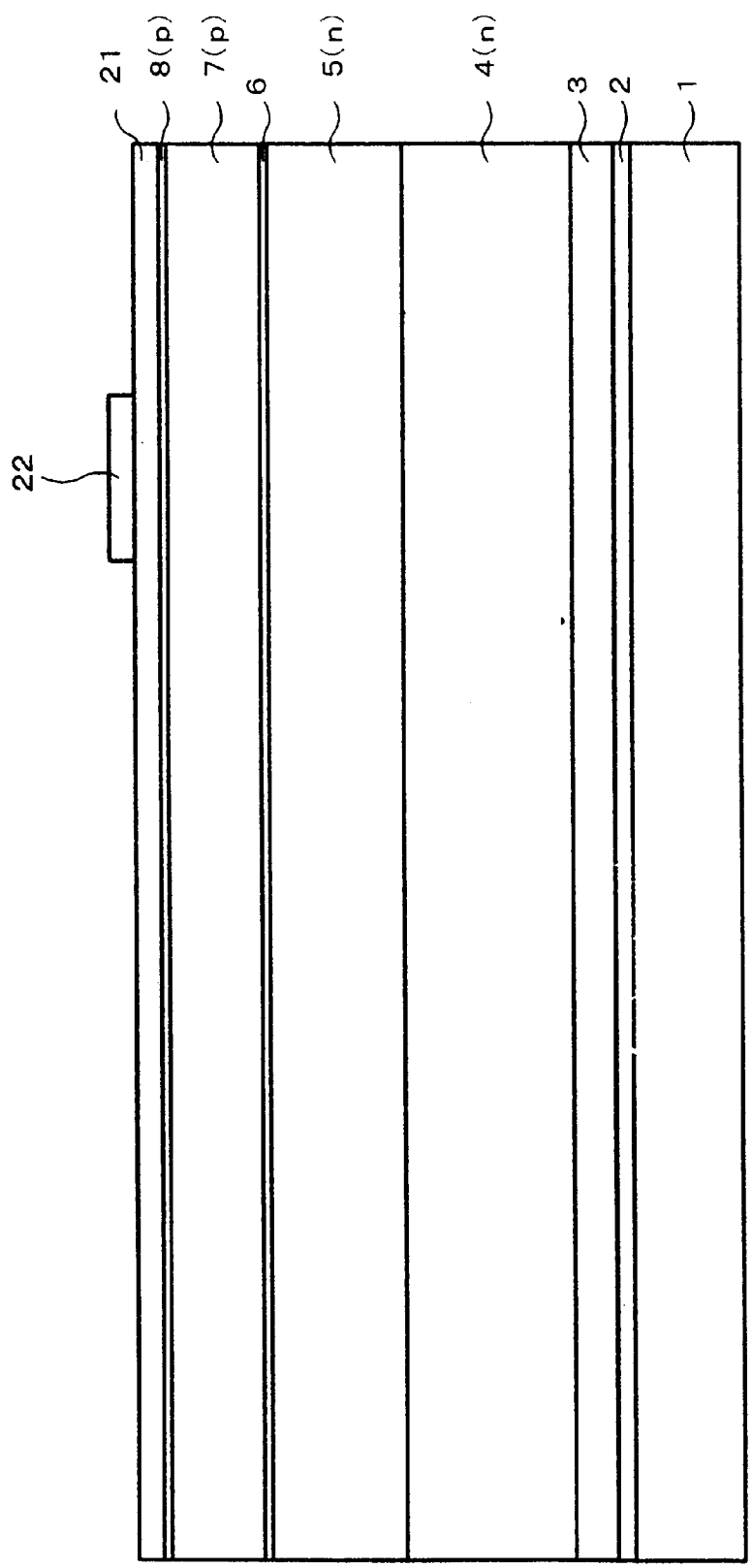
FIG. 3 is a cross-sectional view for explaining the manufacturing method of the GaN semiconductor laser according to the first embodiment of the invention.

Next as shown in FIG. 3, after a SiO$_2$ film 21 (first mask), approximately 400 nm thick, is formed on the p-type GaN contact layer 8 by vapor deposition, for example, a predetermined stripe-shaped resist pattern 22 is formed on the SiO$_2$ film 21 by lithography, for example.

Figure 4:
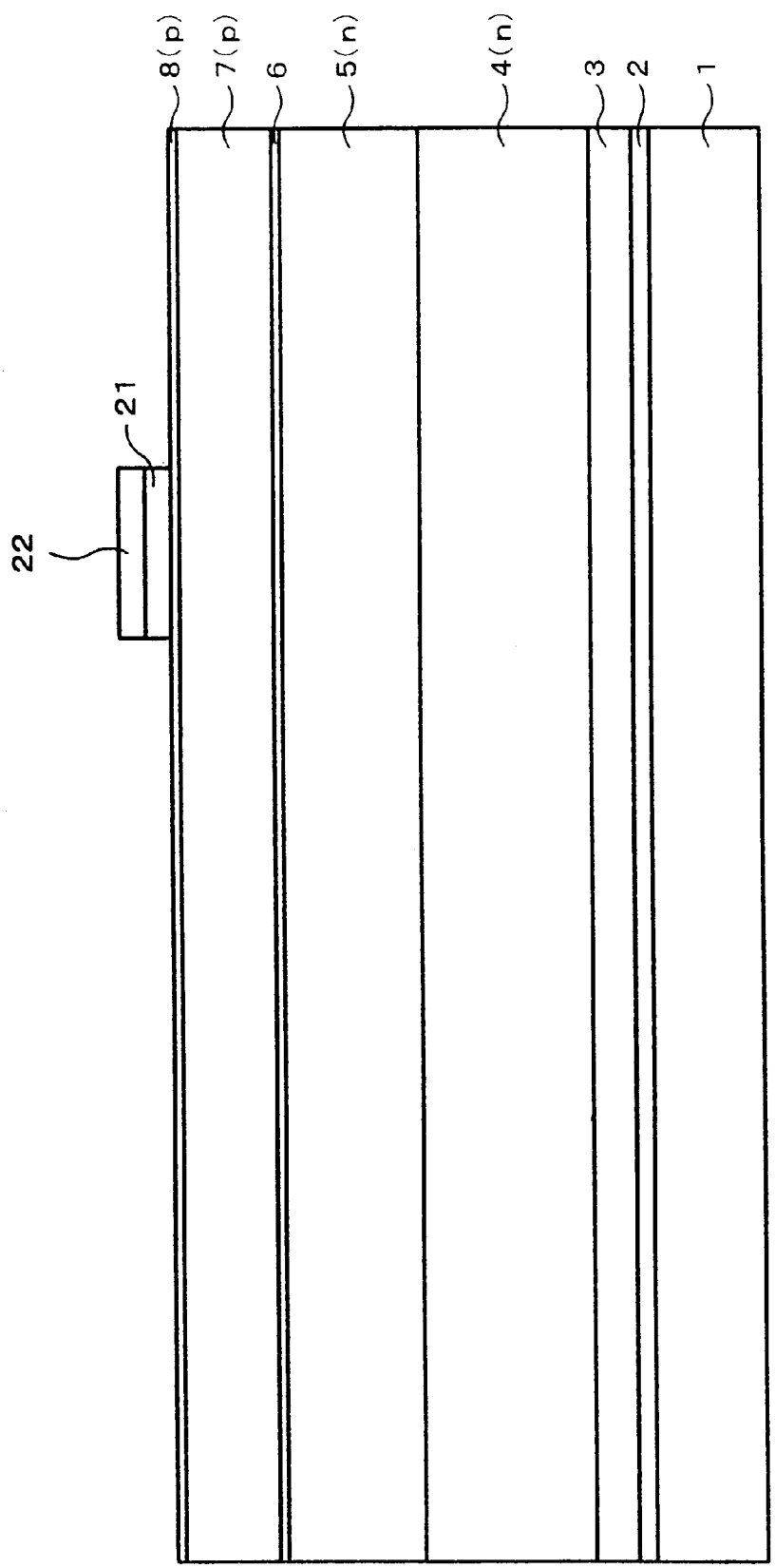
FIG. 4 is a cross-sectional view for explaining the manufacturing method of the GaN semiconductor laser according to the first embodiment of the invention.

Next as shown in FIG. 4, using the resist pattern 22 as a mask, the SiO$_2$ film 21 is selectively etched by dry etching, for example. For this dry etching, CF$_4$ gas, for example, is used as the etching gas. As a result, the SiO$_2$ film 21 is patterned into the predetermined stripe configuration extending in one direction. Thereafter, the resist pattern 22 is removed.

Figure 5:
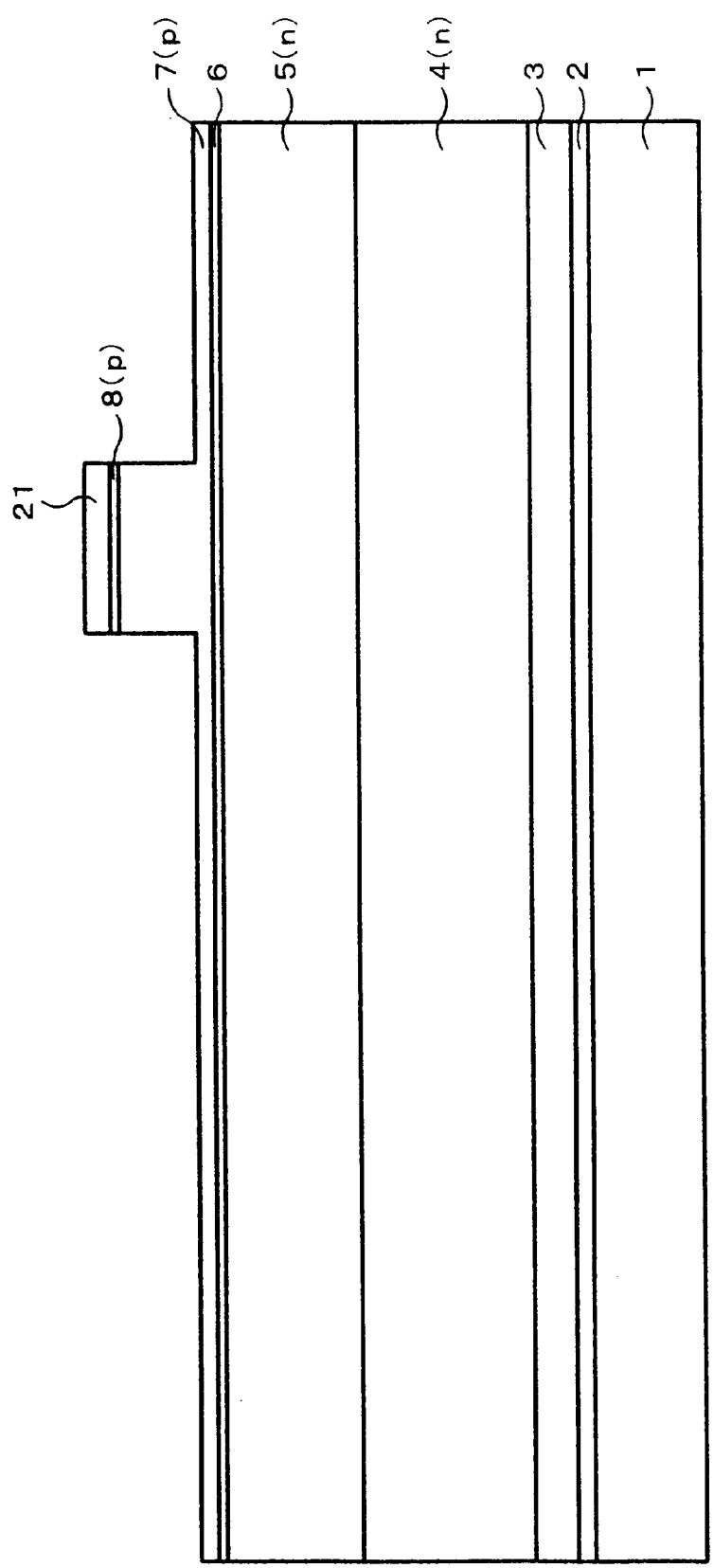
FIG. 5 is a cross-sectional view for explaining the manufacturing method of the GaN semiconductor laser according to the first embodiment of the invention.

Next as shown in FIG. 5, using the stripe-shaped SiO$_2$ film 21 as an etching mask, dry etching such as RIE, for example, is conducted to the depth reaching an intermediate depth of the p-type AlGaN cladding layer 7. For this dry etching, a chlorine-based gas, for example, is used as the etching gas. As a result, the upper-lying part of the p-type AlGaN cladding layer 7 and the p-type GaN contact layer 8 are patterned into a predetermined ridge stripe configuration extending in one direction.

Figure 6:
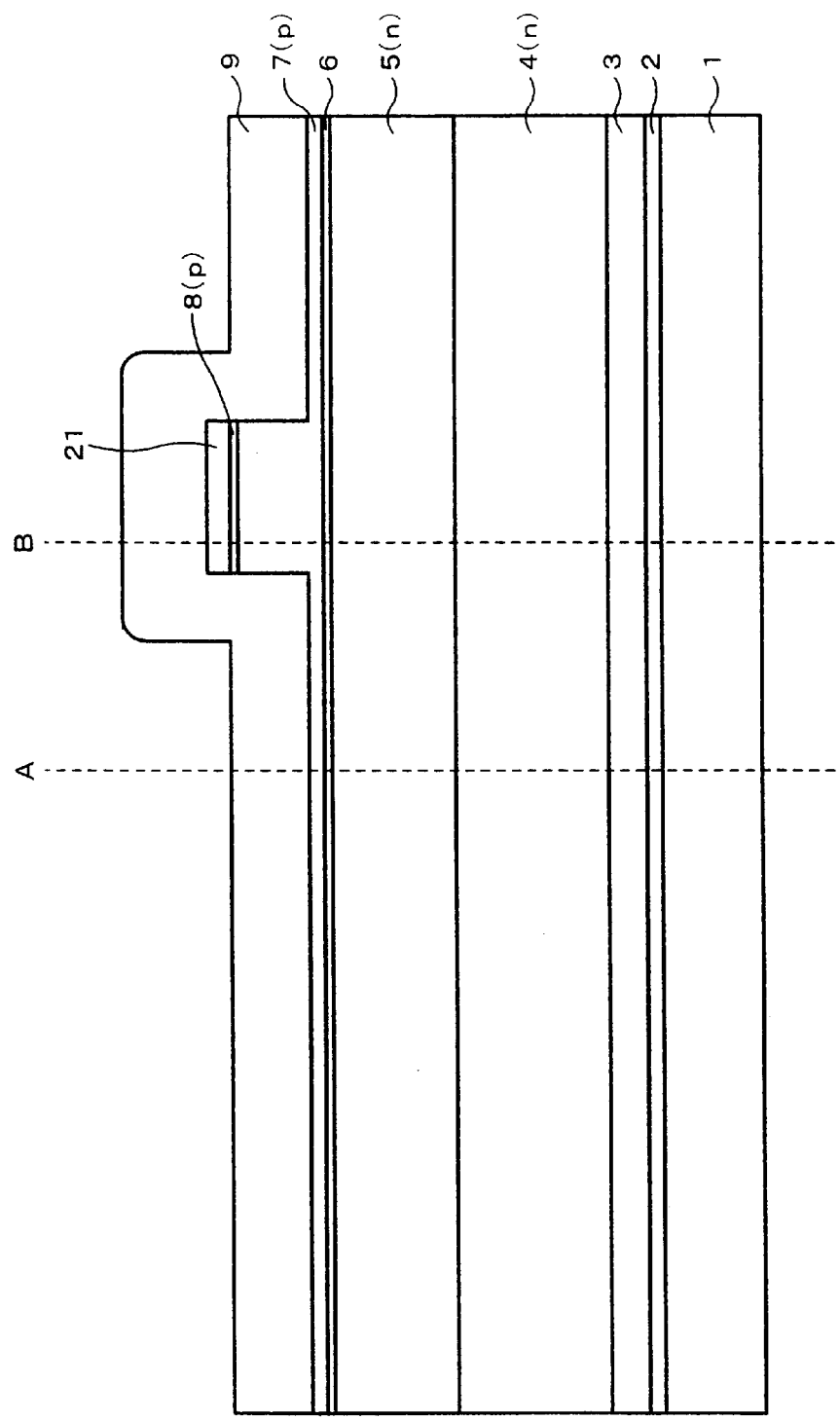
FIG. 6 is a cross-sectional view for explaining the manufacturing method of the GaN semiconductor laser according to the first embodiment of the invention.

Next as shown in FIG. 6, while maintaining the $SiO_2$ film 21 used as the etching mask on the p-type GaN contact layer 8 on the top of the ridge stripe portion, and adjusting the growth temperature to 720 ° C., for example, the undoped AlGaN buried layer 9 is grown by MOCVD to bury both sides of the ridge stripe portion. The AlGaN buried layer 9 is non-selectively grown on the p-type AlGaN cladding layer 7 in both sides of the ridge stripe portion and on the the $SiO_2$ film 21. In this case, due to influences from the amorphous phase of the $SiO_2$ film, the AlGaN buried layer 9 grows in a polycrystalline form on the $SiO_2$ film 21. The AlGaN buried layer 9 grown on the p-type AlGaN cladding layer 7 in both sides of the ridge stripe portion has a better crystalline quality than the AlGaN buried layer 9 grown on the $SiO_2$ film 21 because the p-type AlGaN cladding layer 7 is single-crystalline. In the first embodiment, the AlGaN buried layer 9 explained above is grown to be 1 $\mu$m thick, for example, in the areas on both sides of the ridge stripe portion (cross-section A). In this case, thickness of the AlGaN buried layer in the area corresponding to the ridge stripe is 1.2 $\mu$m.

Figure 7:
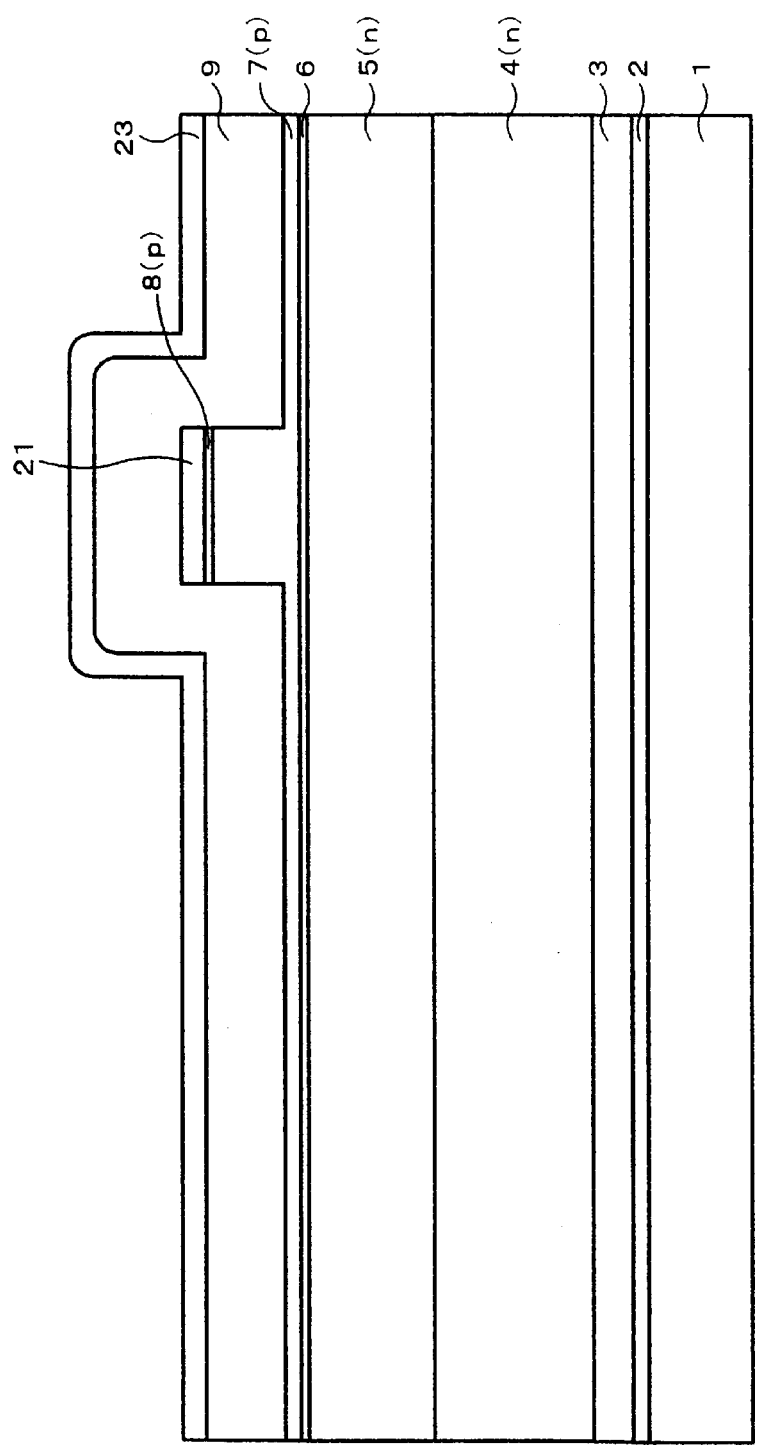
FIG. 7 is a cross-sectional view for explaining the manufacturing method of the GaN semiconductor laser according to the first embodiment of the invention.

Next as shown in FIG. 7, a $SiO_2$ film 23 (second mask), approximately 300 nm thick, is formed on the AlGaN buried layer 9 by CVD, for example. The $SiO_2$ film 23 may be made by vapor deposition instead of CVD.

Figure 8:
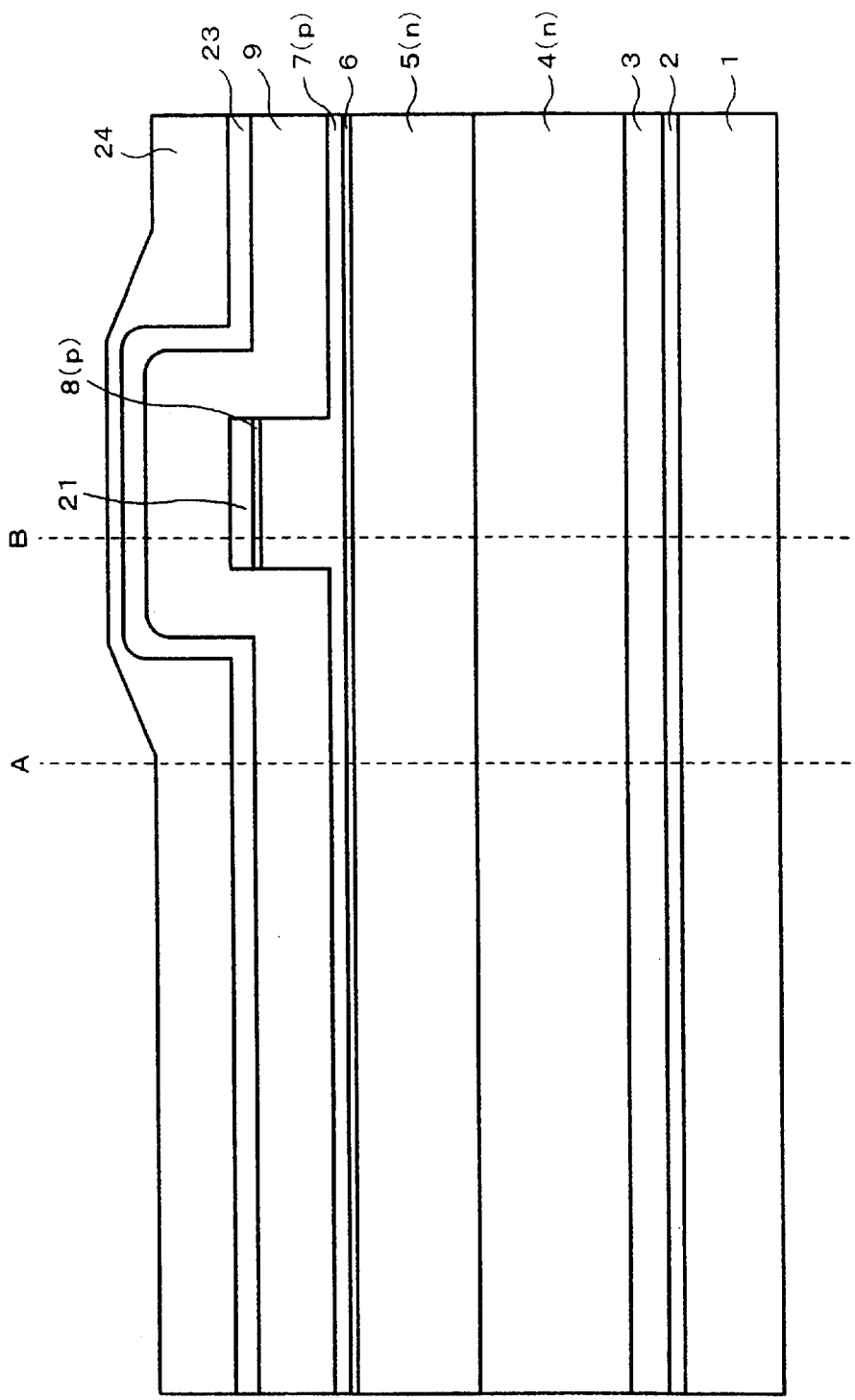
FIG. 8 is a cross-sectional view for explaining the manufacturing method of the GaN semiconductor laser according to the first embodiment of the invention.

Next as shown in FIG. 8, a resist film 24 is coated to a predetermined thickness on the entire surface. Here, the resist film 24 is coated by spin coating, for example, under a condition where the thickness on an even substrate be 900 nm. As a result, thickness of the resist film 24 becomes 900 nm in the areas on both sides of the ridge stripe portion (cross section A) and 150 nm in the area corresponding to the ridge stripe portion (cross section B).

Figure 9:
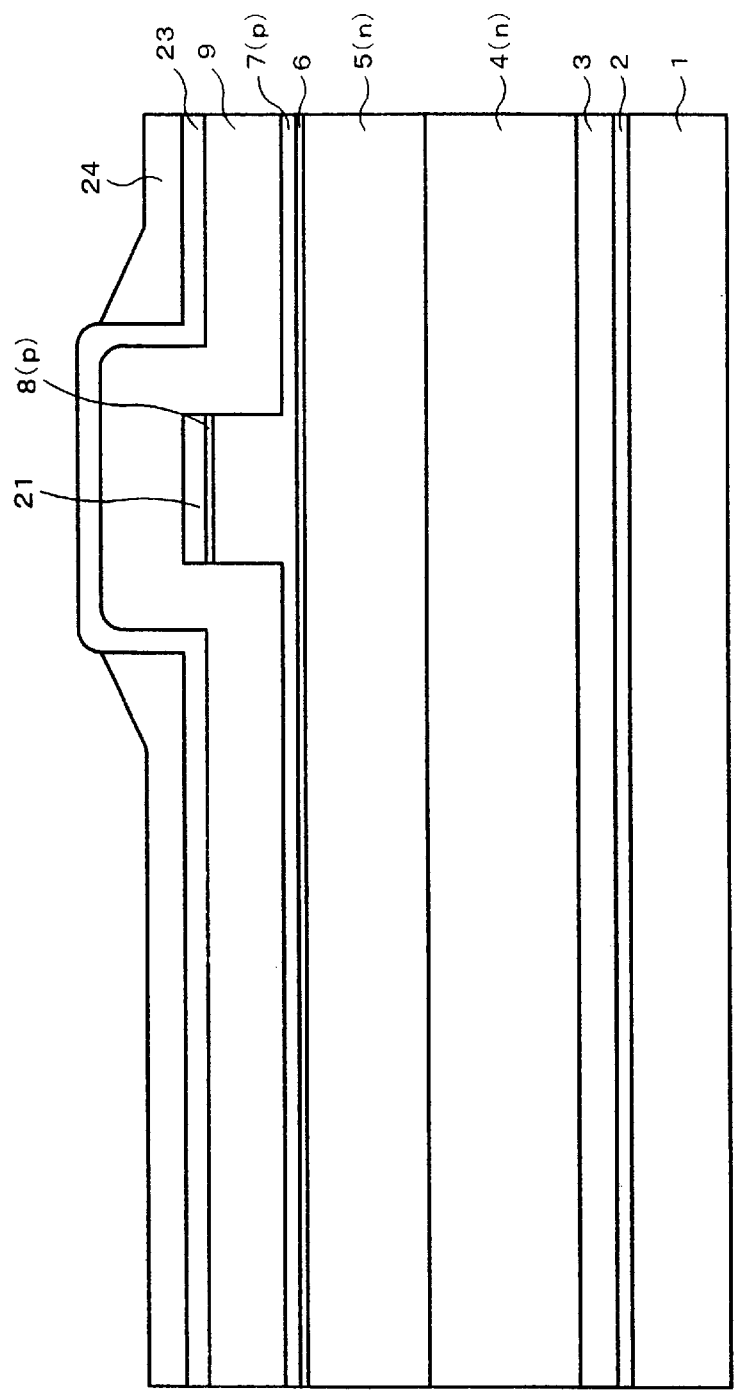
FIG. 9 is a cross-sectional view for explaining the manufacturing method of the GaN semiconductor laser according to the first embodiment of the invention.

Next as shown in FIG. 9, the resist film 24 is etched by dry etching, for example by a depth around 500 nm, for example. As a result, the resist film 24 is removed from above the ridge stripe portion to expose the surface of the $SiO_2$ film 23 solely in this area.

Figure 10:
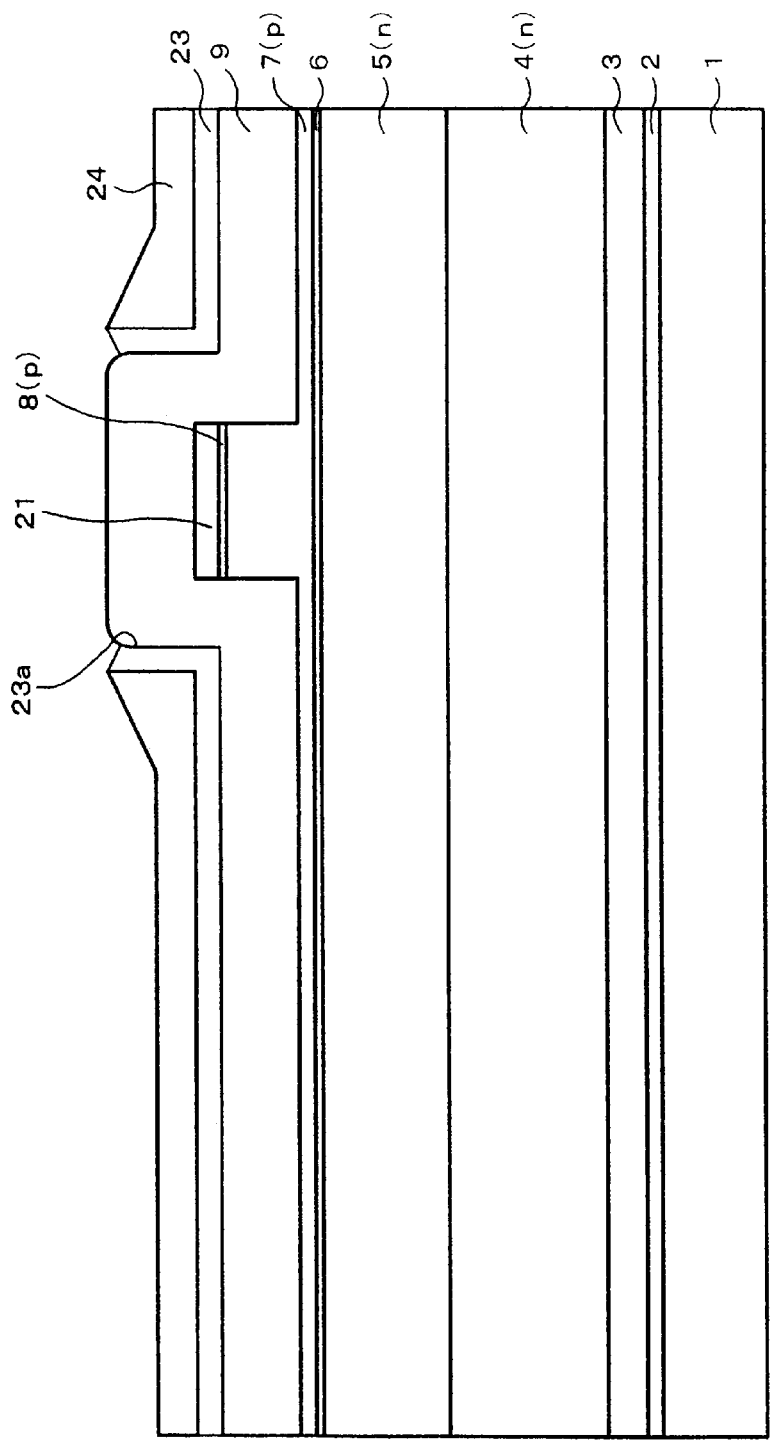
FIG. 10 is a cross-sectional view for explaining the manufacturing method of the GaN semiconductor laser according to the first embodiment of the invention.

Next as shown in FIG. 10, using the resist film 2 as a mask, the $SiO_2$ film 23 is selectively etched by dry etching, for example, to made an aperture 23a in the location of the $SiO_2$ film 23 corresponding to the ridge stripe portion. For this dry etching, $CF_4$ gas, for example, is used as the etching gas. Thereafter, the resist film 24 remaining on the substrate is removed by ashing.

Figure 11:
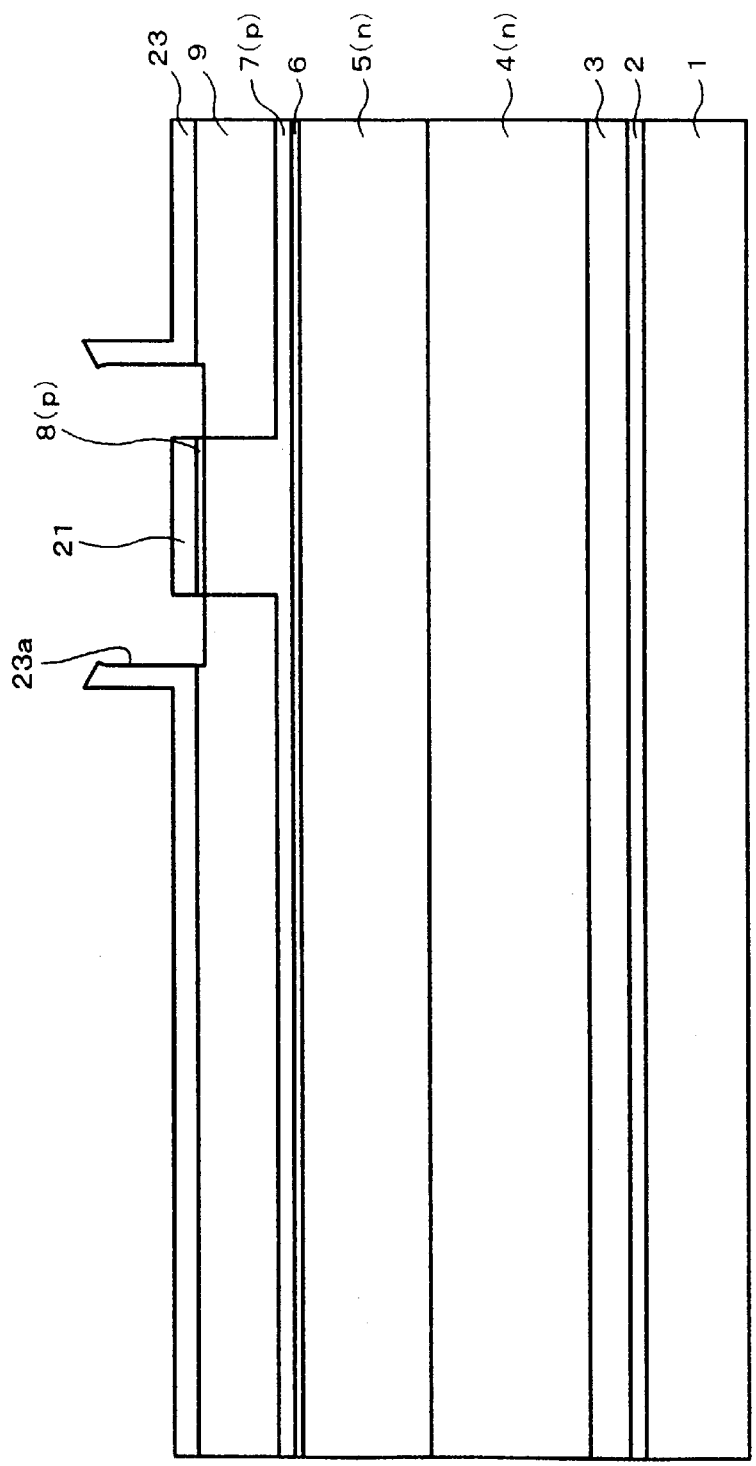
FIG. 11 is a cross-sectional view for explaining the manufacturing method of the GaN semiconductor laser according to the first embodiment of the invention.

Next as shown in FIG. 11, using the $SiO_2$ film 23 on the AlGaN buried layer 9 as an etching mask, the AlGaN buried layer 9 is selectively removed from the aperture 23a by etching until exposing the surface of the $SiO_2$ film 21. For this etching, a potassium hydroxide (KOH) solution heated to 60° C., for example, is used as the etchant. In this case, above the ridge stripe portion, the $SiO_2$ film 21 functions as an etching stop layer. Additionally, this etching utilizes a difference in crystalline property between the AlGaN buried layer 9 grown on the p-type AlGaN cladding layer 7 on both sides of the ridge stripe portion and the AlGaN buried layer grown on the $SiO_2$ film 21. That is, as explained above, the AlGaN buried layer 9 grown on the p-type AlGaN cladding layer 7 in both sides of the ridge stripe portion has a better crystalline quality than the AlGaN buried layer 9 grown in a polycrystalline form on the $SiO_2$ film 21. This difference in crystalline property causes a difference in etching rate of the above-indicated etchant, and the etching automatically stops at the moment when the AlGaN buried layer 9 having a better crystalline property is exposed. As a result, as shown in FIG. 11, the AlGaN buried layer 9 above the ridge stripe portion, i.e., on the $SiO_2$ film, can be selectively removed without leaving any etching dregs near the aperture 23a of the $SiO_2$ film 23.

Figure 12:
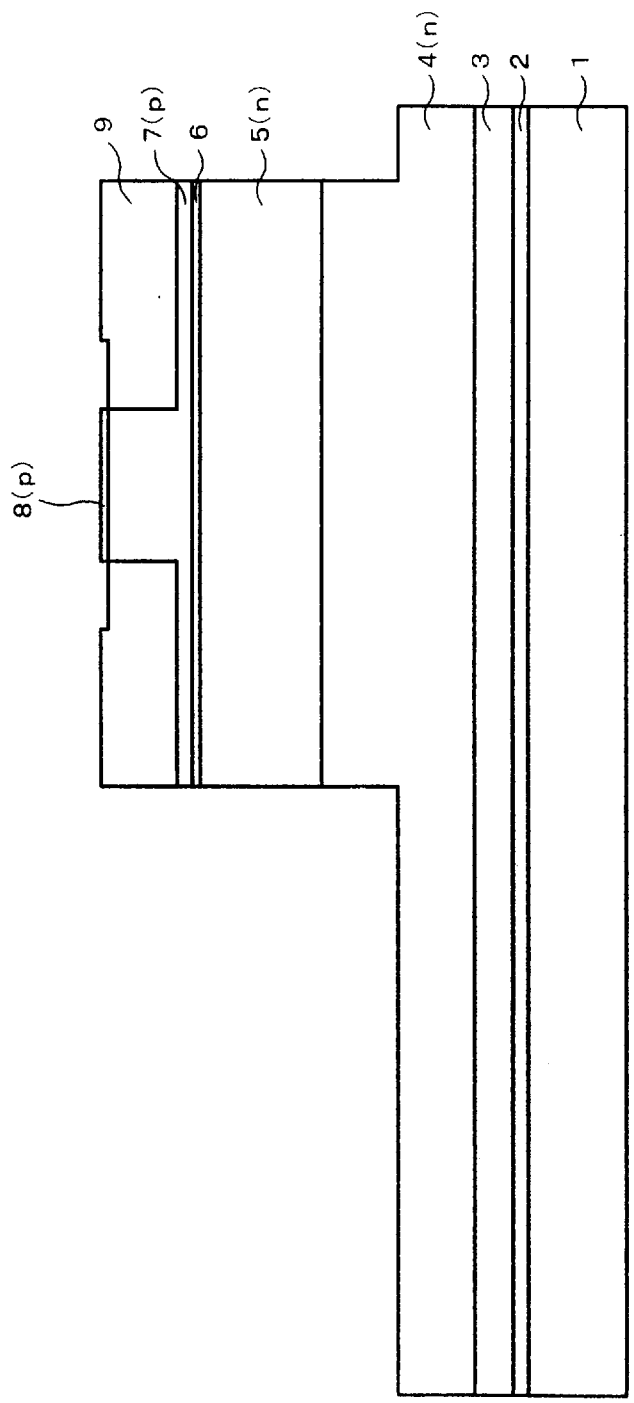
FIG. 12 is a cross-sectional view for explaining the manufacturing method of the GaN semiconductor laser according to the first embodiment of the invention.

After that, the $SiO_2$ film 21 and the $SiO_2$ film 23 are removed by etching using hydrofluoric acid, for example, to thereby expose surfaces of the p-type GaN contact layer 8 and the AlGaN buried layer 9. Thereafter, a stripe-shaped resist pattern (not shown) extending in one direction is formed on the p-type GaN contact layer 8 and the AlGaN buried layer 9 by lithography. Using the resist pattern as a mask, dry etching such as RIE is conducted to the depth reaching an intermediate depth of the n-type GaN contact layer 4 to make a groove. For this dry etching, a chlorine-based gas, for example, is used as the etching gas. The resist pattern is removed thereafter. As a result, as shown in FIG. 12, the upper-lying part of the n-type GaN contact layer 4, n-type AlGaN cladding layer 5, active layer 6, under-lying part of the p-type AlGaN cladding layer 7 and AlGaN buried layer 9 are patterned into a mesa configuration extending in parallel with the extending direction of the ridge stripe portion.

Next as shown in FIG. 1, after making a $SiO_2$ film having a thickness around 100 nm, for example, is formed as the protective film 10 on the entire surface, apertures 10a and 10b are made in the protective film 10 in the location above the ridge stripe portion and in the location above the n-type GaN contact layer 4 adjacent to the mesa portion. Then, by a lift-off technique, the p-side electrode 11 is formed on the p-type GaN contact layer 8 and the AlGaN buried layer 9 exposed through the aperture 10a of the protective film 10, and the n-side electrode 12 is formed on the n-type GaN contact layer 4 exposed through the aperture 10b of the protective film.

After that, cavity edges are made by cleaving the sapphire substrate 1 having formed the laser structure through these steps into bars along a direction vertical of the extending direction of the ridge stripe portion or by dry etching thereof. Further, each bar is divided into chips by dicing or scribing, for example. As a result, the intended GaN compound semiconductor laser is completed.

As explained above according to the first embodiment, since the AlGaN buried layer 9 is non-selectively grown to bury both sides of the ridge stripe portion under the existence of the $SiO_2$ film 21 on the ridge stripe portion, and the AlGaN buried layer 9 located on the ridge stripe portion is removed by etching using the $SiO_2$ film 21 on the ridge stripe portion as an etching stop layer, the p-type GaN contact layer 8 on the top of the ridge stripe portion can be exposed appropriately while using AlGaN difficult to grow selectively as the material of the buried layer. Therefore, the structure burying both sides of the ridge stripe portion with the AlGaN buried layer 9 can be made with a sufficient reproducibility and stably. Additionally, since the AlGaN buried layer 9 buries both sides of the ridge stripe portion, its high current blocking effect enables reduction of the threshold current and the operation current, and the controllability of the transverse refractive index and the heat dissipation effect are improved. As a result, it is possible to stabilize the transverse mode of the GaN semiconductor laser, and realize a high output power and a long lifetime.

Additionally, according to the first embodiment, since the difference in transverse refractive index can be controlled by changing composition of the AlGaN buried layer 9, the controllability of the transverse mode is improved, and freedom of design choice of the semiconductor laser is increased.

Furthermore, according to the first embodiment, since the uneven surface due to the existence of the ridge stripe portion is made flat by burying both sides of the ridge stripe portion with the AlGaN buried layer 9. Therefore, it is possible to prevent breakage of the p-side electrode 11 on the p-type GaN contact layer 8 caused by a difference in level.

Next explained is the second embodiment of the invention. In a manufacturing method of a GaN compound semiconductor laser according to the second embodiment, following the same sequence as used in the manufacturing method of the GaN compound semiconductor according to the first embodiment, the process is progressed up to the step of forming the aperture 23a in the area of the $SiO_2$ film 23 corresponding to the ridge stripe portion (see FIG. 10).

Figure 13:
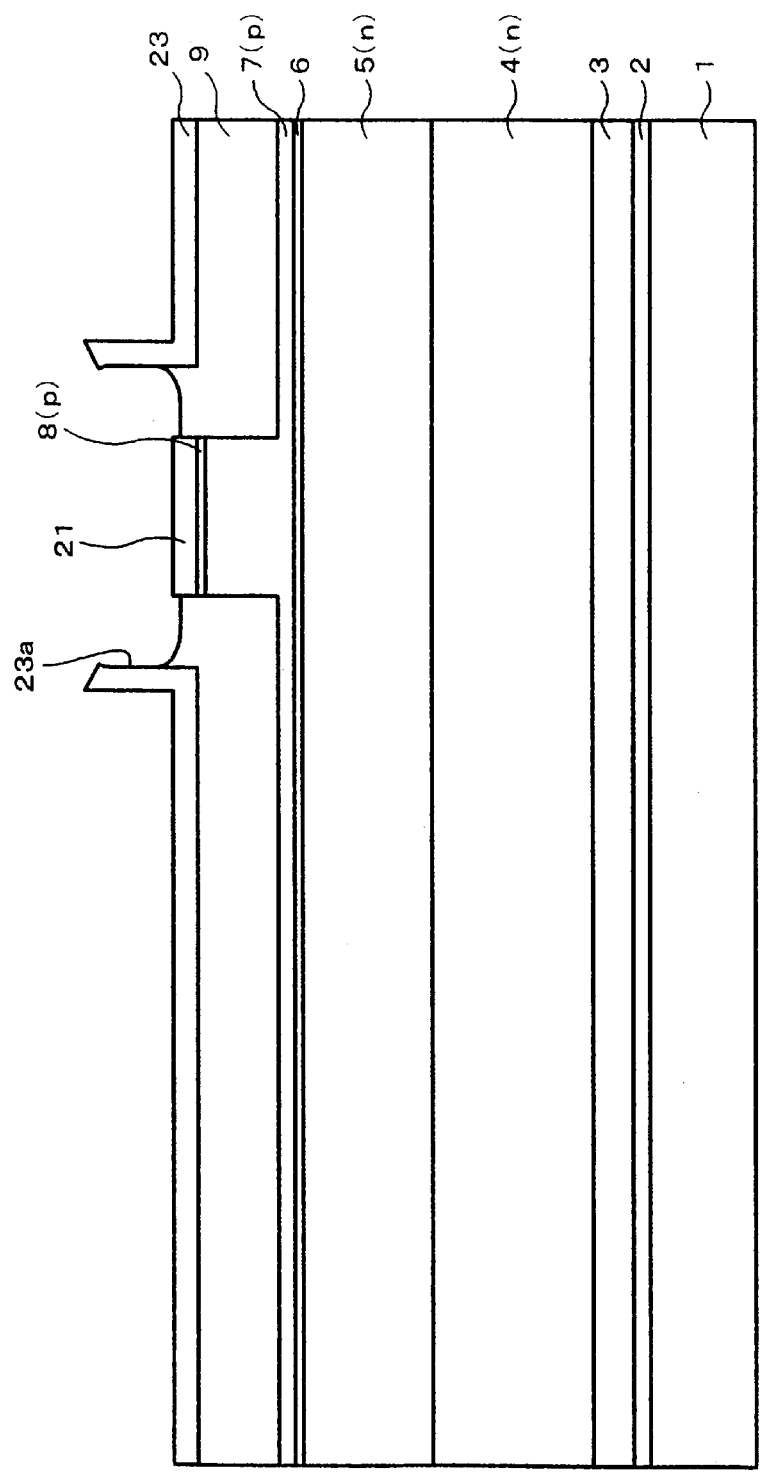
FIG. 13 is a cross-sectional view for explaining a manufacturing method of a GaN semiconductor laser according to the second embodiment of the invention.

Next as shown in FIG. 13, using the $SiO_2$ film 23 on the AlGaN buried layer 9 as an etching mask, the AlGaN buried layer 9 is selectively removed by dry etching like RIE, for example, until exposing the surface of the $SiO_2$ film 21. For this dry etching, a chlorine-based gas, for example, is used as the etching gas. In this case, the $SiO_2$ film 21 functions as an etching stop layer above the ridge stripe portion, and the etching automatically stops when the $SiO_2$ film 21 is exposed. Etching rate selectivity of AlGaN relative to $SiO_2$ during this dry etching is approximately 8.

After that, the $SiO_2$ film 21 and the $SiO_2$ film 23 are removed by etching using hydrofluoric acid, for example, to expose surfaces of the p-type GaN contact layer 8 and the AlGaN buried layer 9. If necessary, a flushing technique is used thereafter to remove etching dregs,(fins) near the aperture 23a of the $SiO_2$ film 23 and thereby flush the surface of the AlGaN buried layer 9.

Subsequently, progressing the same steps as those of the manufacturing method of the GaN compound semiconductor laser according to the first embodiment, the intended GaN compound semiconductor laser is completed. In the other respects, the second embodiment is the same as the first embodiment, and explanation thereof is omitted here.

The second embodiment also has the same advantages as those of the first embodiment.

Next explained is the third embodiment of the invention. In a manufacturing method of a GaN compound semiconductor laser according to the third embodiment, following the same sequence as used in the manufacturing method of the GaN compound semiconductor according to the first embodiment, the process is progressed up to the step of growing the AlGaN buried layer 9 to bury both sides of the ridge stripe portion (see FIG. 6).

Figure 14:
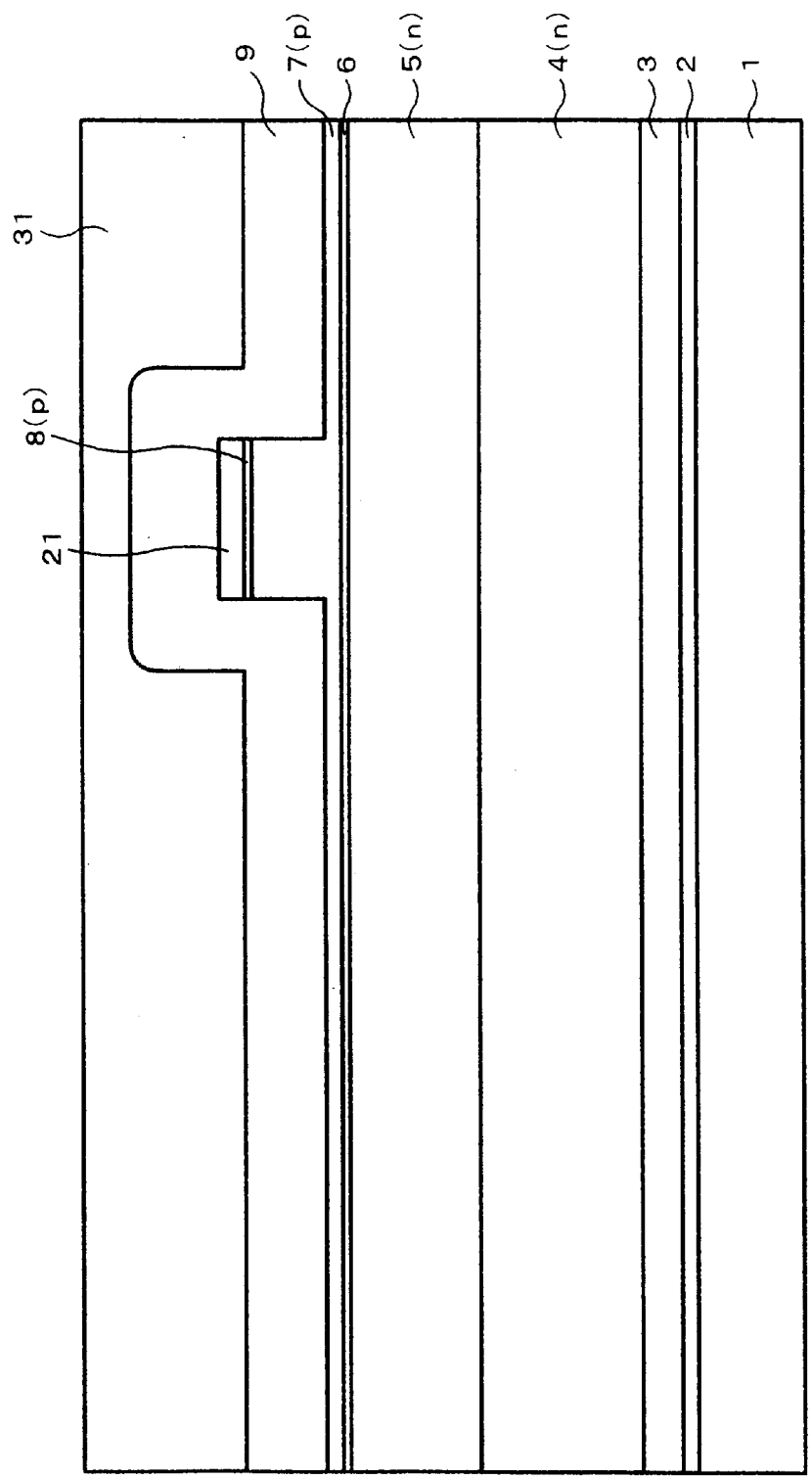
FIG. 14 is a cross-sectional view for explaining a manufacturing method of a GaN semiconductor laser according to the third embodiment of the invention.

After that, as shown in FIG. 14, a resist film 31 is coated on the entire surface up to a predetermined thickness. In this case, the resist film 31 is made thick enough to substantially flush the surface. In this example, the resist film 31 is coated by spin coating, for example, under a condition where the thickness on an even substrate be 2 μm.

Figure 15:
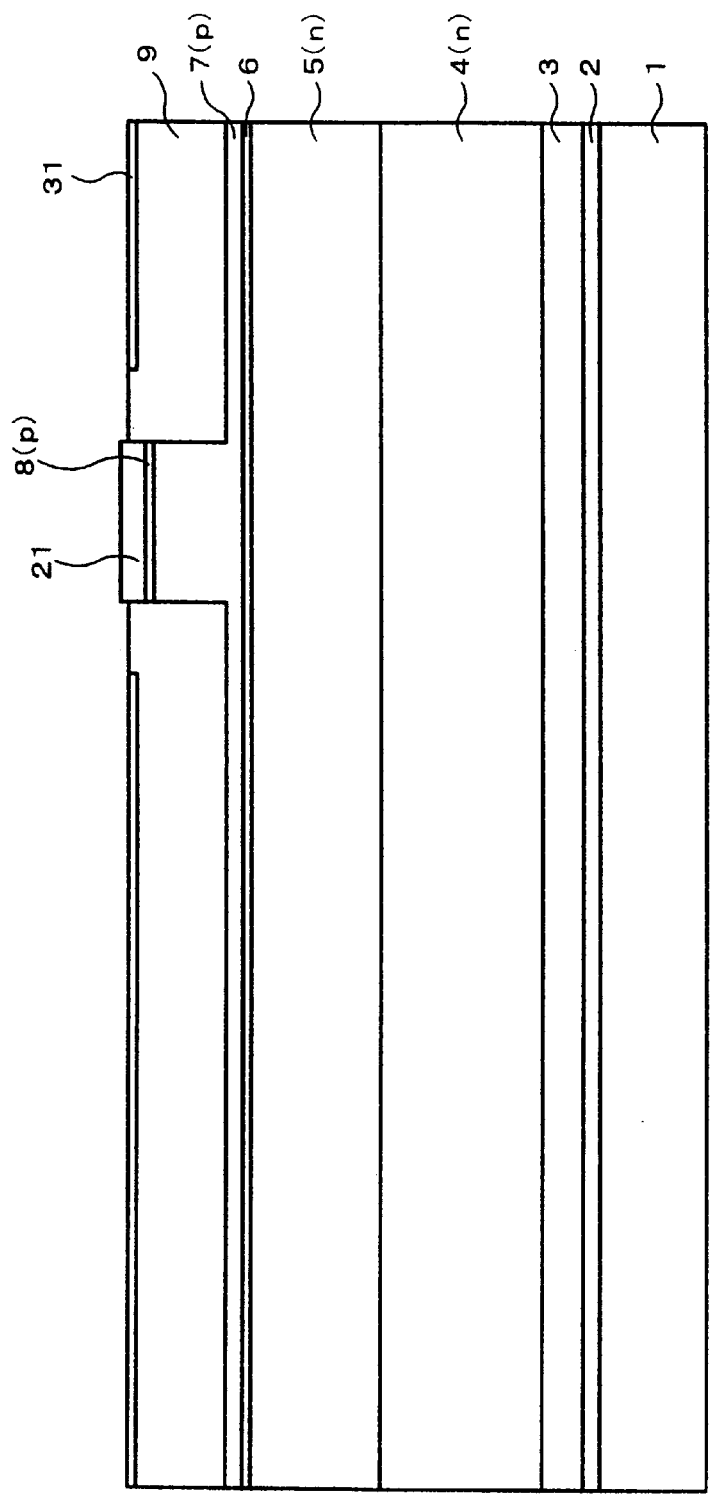
FIG. 15 is a cross-sectional view for explaining the manufacturing method of the GaN semiconductor laser according to the third embodiment of the invention.

Next as shown in FIG. 15, using an etch-back technique by dry etching like RIE, for example, the resist film 31 and the AlGaN buried layer 9 are removed over the entire surface until exposing the surface of the $SiO_2$ film overlying the ridge stripe portion. For this dry etching, a chlorine-based gas, for example, is used as the etching gas. The dry etching is executed under a condition substantially equalizing the etching rate between the resist film 31 and the AlGaN buried layer 9. In this case, the $SiO_2$ film 21 functions as an etching stop layer on the ridge stripe portion. During the dry etching, it is desirable that the surface of the AlGaN buried layer 9 be covered by the resist film 31 in areas in both sides of the ridge stripe portion at the moment when the $SiO_2$ film 21 is exposed. For this purpose, the AlGaN buried layer 9 is preferably controlled in thickness during its growth so that the level of the surface of the AlGaN buried layer 9 in both sides of the ridge stripe portion be lower than the level of the surface of the $SiO_2$ film 21.

Figure 16:
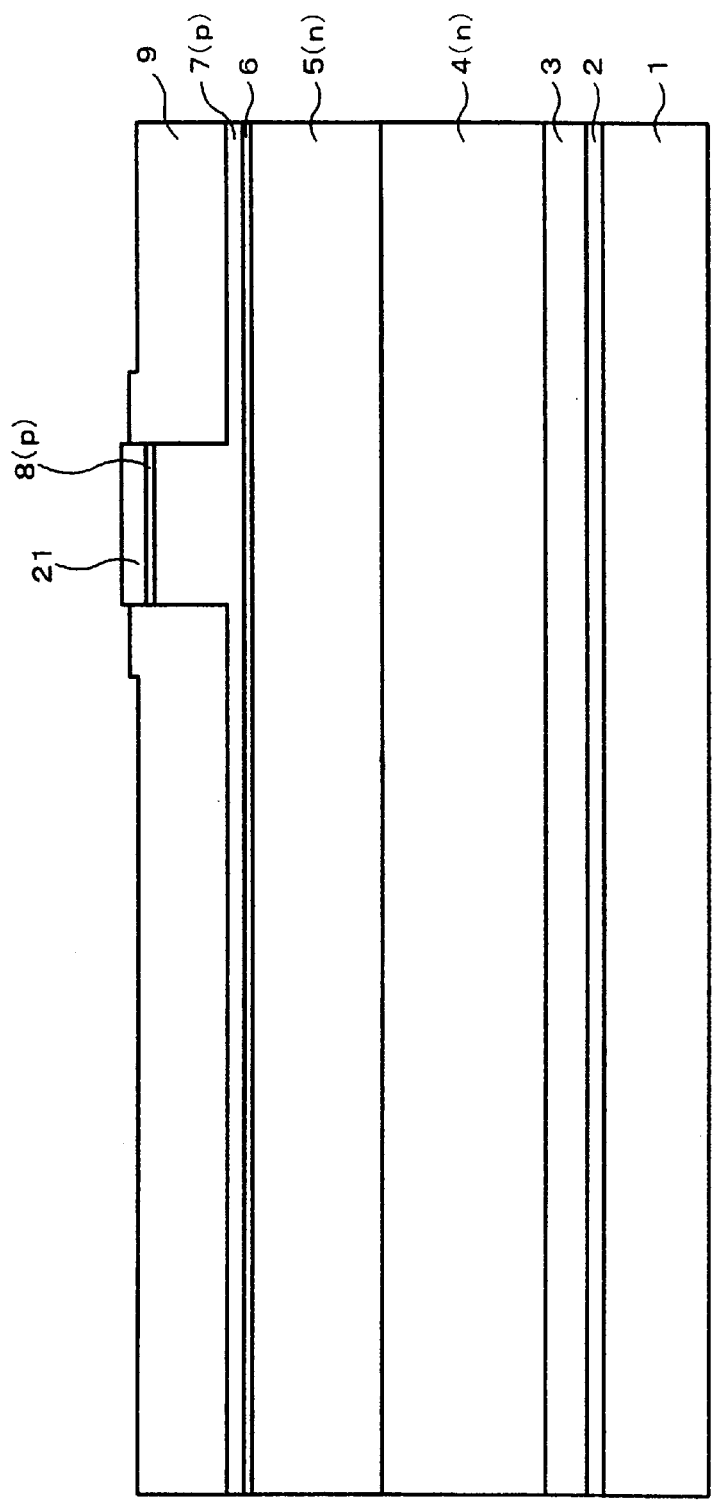
FIG. 16 is a cross-sectional view for explaining the manufacturing method of the GaN semiconductor laser according to the third embodiment of the invention.

Next as shown in FIG. 16, the resist film 31 remaining on the substrate is removed by ashing, for example. Thereafter, the $SiO_2$ film 21 is removed by etching using hydrofluoric acid, for example, to expose the surface of the p-type GaN contact layer 8. If necessary, a flushing technique is used thereafter to flush the surface of the AlGaN buried layer 9.

Subsequently, progressing the same steps as those of the manufacturing method of the GaN compound semiconductor laser according to the first embodiment, the intended GaN compound semiconductor laser is completed. In case of the manufacturing method of the GaN compound semiconductor laser according to the third embodiment, the number of steps is reduced as compared with the manufacturing method of the GaN compound semiconductor laser according to the first embodiment, as many as permitting omission of the step of making the $SiO_2$ film 23 on the AlGaN buried layer 9 and the step of making the aperture 23a in the $SiO_2$ film 23. In the other respects, the third embodiment is the same as the first embodiment, and explanation thereof is omitted here.

The third embodiment also promises the same advantages as those of the first embodiment.

Next explained is the fourth embodiment of the invention. In a manufacturing method of a GaN compound semiconductor laser according to the fourth embodiment, following the same sequence as used in the manufacturing method of the GaN compound semiconductor according to the first embodiment, the process is progressed up to the step of patterning the upper-lying part of the p-type AlGaN cladding layer 7 and the p-type GaN contact layer 8 into a predetermined ridge stripe configuration extending in one direction (see FIG. 5) by dry etching using the stripe-shaped $SiO_2$ film 21 as the mask.

Figure 17:
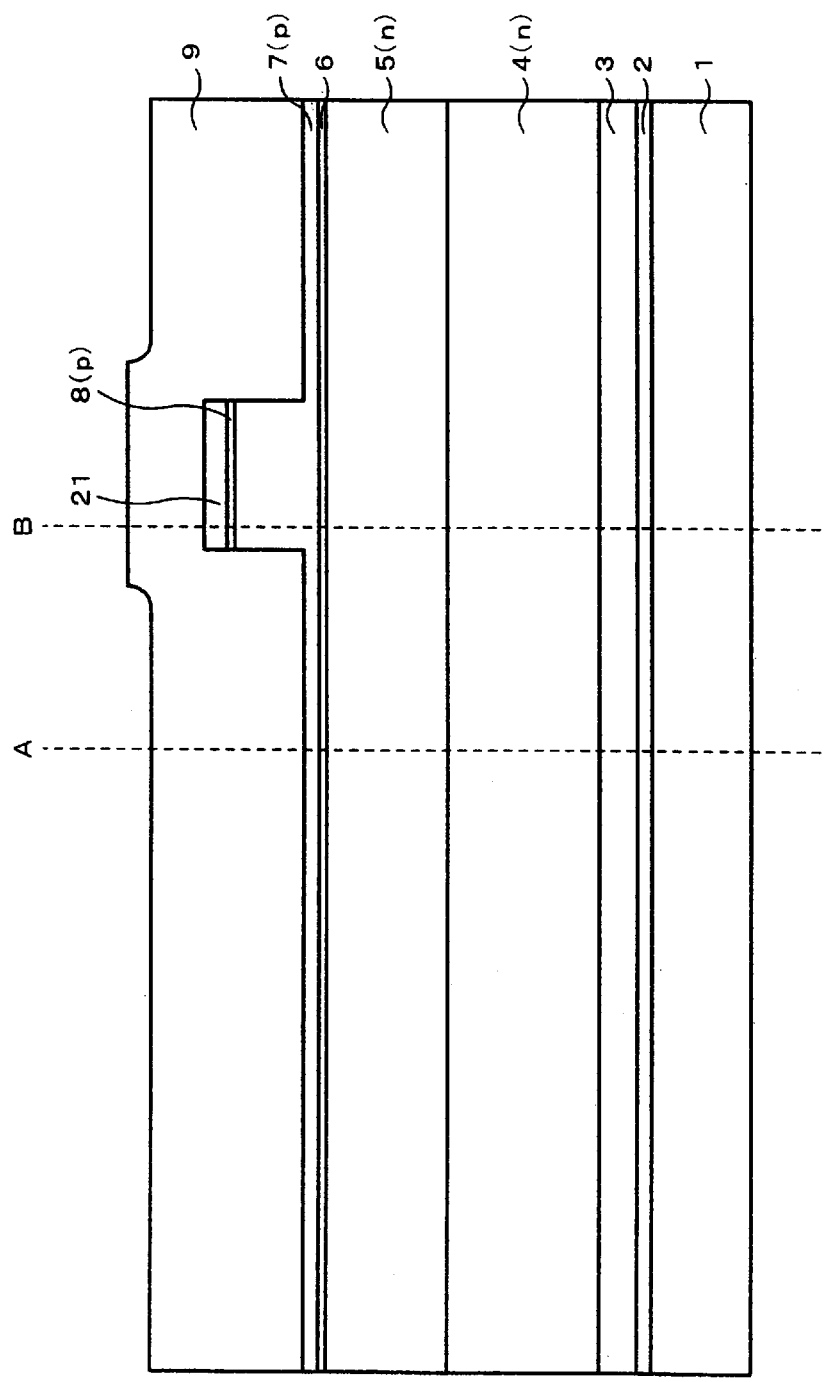
FIG. 17 is a cross-sectional view for explaining a manufacturing method of a GaN semiconductor laser according to the fourth embodiment of the invention.

Next as shown in FIG. 17, while maintaining the $SiO_2$ film 21 on the p-type GaN contact layer 8 on the top of the ridge stripe portion, an undoped AlGaN buried layer 9 is grown to bury both sides of the ridge stripe portion by MOCVD under the growth temperature of 990° C., for example. Under the condition, the growth rate of the AlGaN buried layer 9 on the p-type AlGaN cladding layer 7 in the areas in both sides of the ridge stripe portion is approximately twice the growth rate of the AlGaN buried layer on the $SiO_2$ formed on the ridge stripe portion. In the fourth embodiment, the AlGaN buried layer 9 is grown, for example, to be 2 μm thick in the areas corresponding to opposite sides of the ridge stripe portion (cross section A) and 1 μm in the area corresponding to the ridge stripe portion (cross section B).

Figure 18:
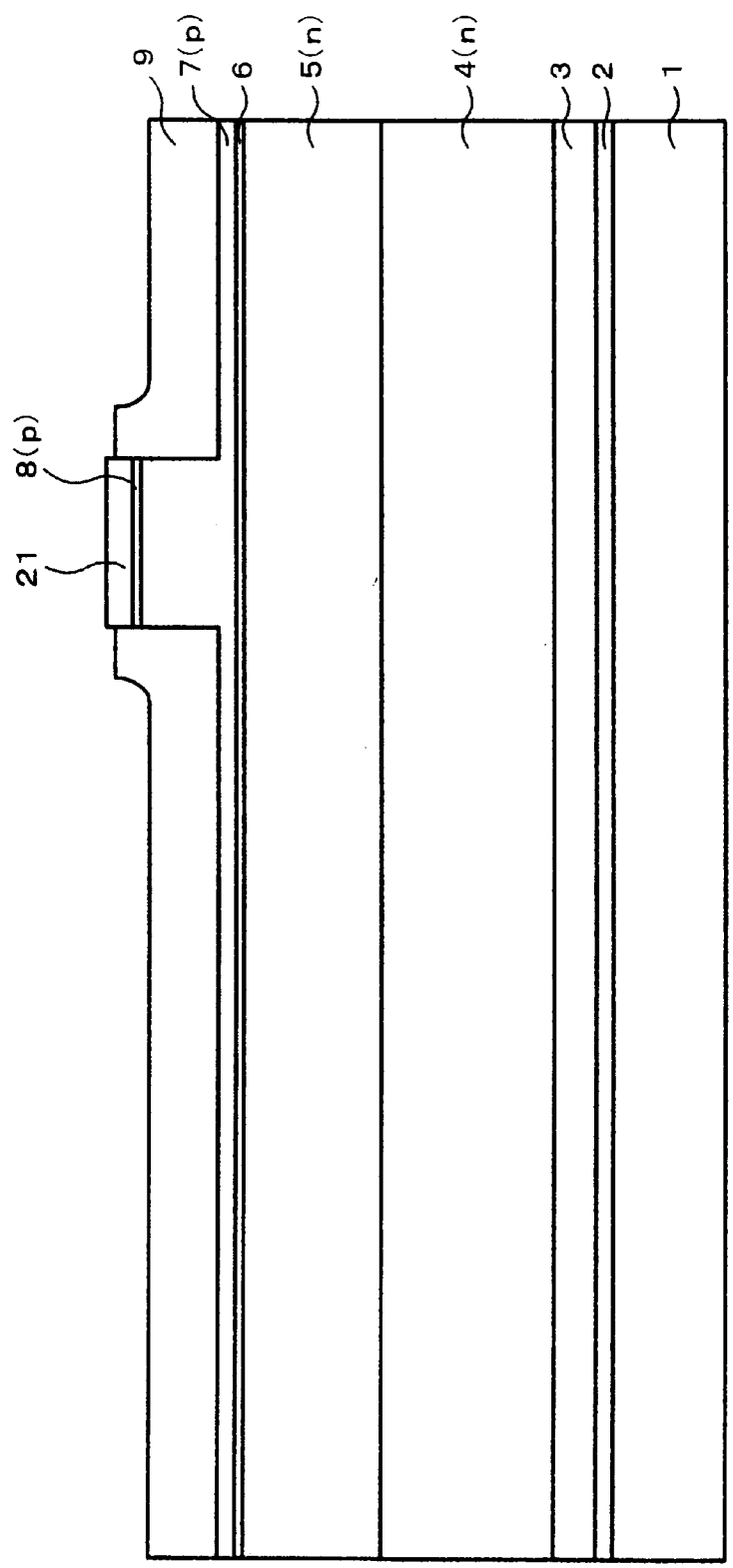
FIG. 18 is a cross-sectional view for explaining the manufacturing method of the GaN semiconductor laser according to the fourth embodiment of the invention.

Next as shown in FIG. 18, the AlGaN buried layer 9 is removed over the entire area by an etch-back process using dry etching such as RIE, for example, until exposing the surface of the $SiO_2$ film 21 formed on the ridge stripe portion. For this dry etching, a chlorine-based gas, for example, is used as the etching gas. In this case, the $SiO_2$ film 21 functions as an etching stop layer on the ridge stripe portion.

Subsequently, progressing the same steps as those of the manufacturing method of the GaN compound semiconductor laser according to the first embodiment, the intended GaN compound semiconductor laser is completed. In case of the manufacturing method of the GaN compound semiconductor laser according to the fourth embodiment, the number of steps is reduced as compared with the manufacturing method of the GaN compound semiconductor laser according to the first embodiment, as many as permitting omission of the step of making the $SiO_2$ film 23 on the AlGaN buried layer 9 and the step of making the aperture 23a in the $SiO_2$ film 23. Also as compared with the manufacturing method of the GaN compound semiconductor laser according to the third embodiment, the number of steps is reduced as many as permitting omission of the step for making the resist film 31 on the AlGaN buried layer 9. In the other respects, the fourth embodiment is the same as the first embodiment, and explanation thereof is omitted here.

The fourth embodiment also promises the same advantages as those of the first embodiment.

Having described specific preferred embodiments of the present invention with reference to the accompanying drawings, it is to be understood that the inventions is not limited to those precise embodiments, and that various changes and modifications may be effected therein by one skilled in the art without departing from the scope or the spirit of the invention as defined in the appended claims.

For example, numerical values, structures, materials, and processes raised in the explanation of the first to fourth embodiments are not but examples, and any other appropriate numerical values, structures, materials and processes may be used if necessary.

More specifically, although the first to fourth embodiment use an undoped AlGaN layer as the buried layer 9, an n-type AlGaN buried layer may be used instead of the undoped AlGaN buried layer 9. Usable as the material of the buried layer is a material absorbing light from the active layer, such as GaInN, in lieu of AlGaN.

The $SiO_2$ film 21 in the first to fourth embodiments may also be replaced by a SiN film. Similarly, the $SiO_2$ film 23 in the first embodiment may be replaced with a SiN film.

The first to fourth embodiments may be modified to form a stripe-shaped $SiO_2$ or SiN film on the GaN buffer layer 3 and form a GaN layer on the GaN buffer layer 3 by lateral epitaxial growth by ELOG (epitaxial lateral over-growth) using the $SiO_2$ or SiN film as the growth mask.

Although the first to fourth embodiments have been explained as using the sapphire substrate 1 as the substrate of the laser, a spinel substrate, SiC substrate, ZnO substrate or GaP substrate, for example, may be used instead of the sapphire substrate, if necessary. Also usable are substrates prepared by growing a nitride III–V compound semiconductor layer on those substrates, those prepared by first growing a nitride III–V compound semiconductor layer on those substrates and thereafter removing the substrates to have the nitride III–V compound semiconductor layer alone, and those made up of a nitride III–V compound semiconductor itself, such as GaN substrate.

The first to fourth have been explained as applying the invention to GaN compound semiconductor lasers having a DH structure (double heterostructure). However, the invention is also applicable to, needless to say, GaN semiconductor lasers having a SCH structure (separate confinement heterostructure), and also to GaN optical diodes. Moreover, the same technique as the burying and flushing technique used in the present invention may be used also to fabrication of a semiconductor device selectively burying a nitride III–V compound semiconductor layer in a recess formed in another nitride III–V compound semiconductor layer.

As described above, according to the invention, since the buried layer is non-selectively grown on the second cladding layer under the existence of the mask on the stripe portion, and the buried layer located on the stripe portion is removed by etching using the mask on the stripe portion as an etching stop layer, the structure burying both sides of the stripe portion with the buried layer can be made with a sufficient reproducibility and stably while using materials difficult to selectively grow as the material of the buried layer. Therefore, room for selection of the material of the buried layer is expanded, and AlGaN optimum for controlling the transverse mode can be used as well as the material of the buried layer. Additionally, since the buried layer buries both sides of the stripe portion, the controllability of the transverse refractive index and the heat dissipation effect are improved, and it results in stabilizing the transverse mode of a semiconductor light emitting device using a nitride III–V compound semiconductor, ensuring a high output power and elongating the lifetime.

What is claimed is:

1. A manufacturing method for manufacturing a semiconductor light emitting device using a nitride III–V compound semiconductor, comprising the steps of:

sequentially growing a first cladding layer of a first conduction type, an active layer and a second cladding layer of a second conduction type on a substrate;

forming a stripe portion in said second cladding layer;

non-selectively growing a buried layer on said second cladding layer under the presence of a mask on said stripe portion; and selectively removing said buried layer from above said stripe portion by etching using said mask on said stripe portion as an etching stop layer.

2. The manufacturing method according to claim 1 wherein said buried layer is a layer of a first conduction type or an undoped layer.

3. The manufacturing method according to claim 1 wherein said buried layer has a lower refractive index than said second cladding layer.

4. The manufacturing method according to claim 1 wherein said buried layer is made of a nitride III–V compound semiconductor.

5. The manufacturing method according to claim 4 wherein said buried layer is made of AlGaN.

6. The manufacturing method according to claim 1 wherein said mask formed on said stripe portion is a mask used as an etching mask when said stripe portion is made in said second cladding layer.

7. The manufacturing method according to claim 1 wherein a further mask having an aperture in an area corresponding to said stripe portion is formed on said buried layer, and said buried layer is selectively removed from above said stripe portion by etching using said mask overlying said stripe portion and said further mask overlying said buried layer as an etching stop layer.

8. The manufacturing method according to claim 1 wherein said buried layer is selectively removed from above said stripe portion by using a difference in crystalline property between a part of said buried layer grown on said second cladding layer and the other part of said buried layer grown on said mask on said stripe portion.

* * * * *